United States Patent [19]
Schwed et al.

[11] Patent Number: 5,241,689
[45] Date of Patent: Aug. 31, 1993

[54] DIGITAL SIGNAL PROCESSOR AUDIO COMPRESSION IN AN RF BASE STATION SYSTEM

[75] Inventors: Daniel I. Schwed; Rodney L. Nickel; John R. Martin, all of Lynchburg, Va.

[73] Assignee: Ericsson GE Mobile Communications Inc., Lynchburg, Va.

[21] Appl. No.: 624,732

[22] Filed: Dec. 7, 1990

[51] Int. Cl.⁵ ............................................. H04B 7/00
[52] U.S. Cl. .................................... 455/54.1; 455/63; 455/72
[58] Field of Search .................. 455/33, 52, 54, 56, 455/72, 63, 33.1, 52.1, 54.1, 56.1; 375/122, 30, 28; 381/94

[56] References Cited

U.S. PATENT DOCUMENTS

| | | | |
|---|---|---|---|
| 3,449,684 | 6/1969 | Kagan . | |
| 4,110,699 | 8/1978 | Bethards | 328/168 |
| 4,216,427 | 8/1980 | Bethards | 455/119 |
| 4,323,731 | 4/1982 | Hershberg | 455/114 |
| 4,355,304 | 10/1982 | Kasuga et al. | 455/72 |
| 4,381,488 | 4/1983 | Fricke et al. | 333/14 |
| 4,539,707 | 9/1985 | Jacobs et al. | 455/47 |
| 4,630,304 | 12/1986 | Borth et al. | 381/94 |
| 4,700,361 | 10/1987 | Todd et al. | 375/27 |
| 4,700,362 | 10/1987 | Todd et al. | 375/30 |
| 4,718,116 | 1/1988 | Jacobs et al. | 455/245 |
| 4,809,274 | 2/1989 | Walker et al. | 371/37 |
| 4,839,906 | 6/1989 | Leveque et al. | 375/37 |
| 4,876,741 | 10/1989 | Jacobs et al. | 455/47 |
| 5,016,205 | 5/1991 | Shumway | 375/98 |

OTHER PUBLICATIONS

Instructions for Audio Boards 19A129924G1-G3 Ericsson GE Maintenance Manual LBI-30705J (1977).
4006 Compression Amplifier, TELLABS Technical Manual 76-814006, (Feb. 2, 1977), (rev. B. Jul. 1989).
Linear LSI Data and Applications Manual 1985, Signetics, (1985).

Primary Examiner—Reinhard J. Eisenzopf
Assistant Examiner—Edward Urban
Attorney, Agent, or Firm—Nixon & Vanderhye

[57] ABSTRACT

A radio frequency (RF) base station transmitter receiver (transceiver) system includes an audio compression arrangement that compresses a sum of multiple audio signals so that all signals within the sum are equalized to a substantially uniform audio output level despite differences in their input levels. Compression thresholds can be adjusted from a remote location. The RF base station provides audio signal compression using digital signal processing (DSP) techniques such that advanced features (e.g., noise blanking and hard limiting) and flexibility are built into the system. Line audio inputs from several sources are filtered, converted to digital signals, and processed by a digital signal processor (DSP). This DSP provides an audio compression function that selects and applies appropriate gains to the digitized audio signal. The compressed signal is converted to analog form, filtered and routed to a variety of destination such as a RF transmitter modulator or a land line.

6 Claims, 10 Drawing Sheets

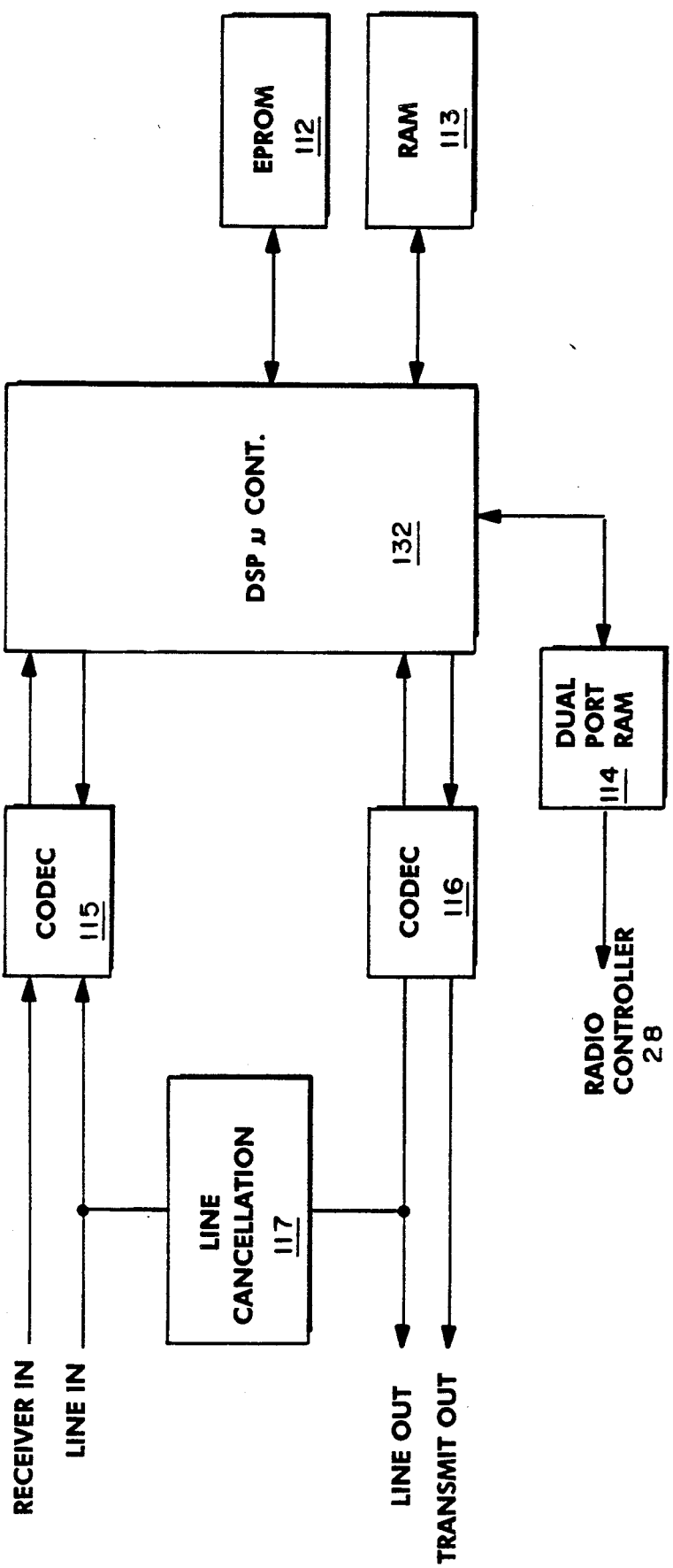

DIGITAL SIGNAL PROCESSOR AUDIO COMPRESSION IN AN RF BASE STATION SYSTEM

FIELD OF THE INVENTION

The present invention relates to radio frequency (RF) transmitting/receiving systems providing audio compression. More specifically, the present invention relates to digital signal processing techniques and systems for providing audio compression within a RF transmission system. Still more particularly, the present invention relates to compressing audio signals summed from multiple audio sources (e.g., telephone lines) using a digital signal processor to provide substantially uniform audio signals for RF transmission via a RF base station transceiver.

RELATED APPLICATIONS

The subject application is related to the following commonly assigned copending patent applications (each of which are hereby incorporated by reference herein):

Ser. No. 07/596,357 filed Oct. 12, 1990, entitled "A Full Duplex RF Repeater/Base Station Providing Microprocessor-Controlled Simultaneous CTCSS Tone Encode/Decode."

Ser. No. 07/620,422, filed Dec. 3, 1990, entitled "Remote Control of RF Base Station Via Digital Communications".

Ser. No. 07/620,423, filed Dec. 3, 1990, entitled "Local Area Network for Internal Flexible Digital Communications Within and Between RF Base Stations." and Ser. No. 07/620,421 filed Dec. 3, 1990 entitled "Digital Signal Processor for Radio Base Station".

BACKGROUND AND SUMMARY OF THE INVENTION

RF base stations typically have been used in the past to provide a link between a single land-based dispatcher and one or more mobile (or portable) RF transceivers. However, it has become desirable to permit multiple geographically separated dispatchers to simultaneously communicate with mobile/portable transceivers over the same RF channel.

Taking a fire department communications system as an example (see FIG. 1A), a first dispatcher or other communications participant (e.g., remote A as shown in FIG. 1A) may be located in a fire station; and a second dispatcher or other communications participant (remote B in FIG. 1A) may be located at a local government "911" telephone dispatch facility. The first dispatcher/communicator (remote A) and the second dispatcher/communicator (remote B) can each monitor communications carried by the RF base station, and either dispatcher/communicator can participate in the communications (e.g., to talk to mobile transceiver C) by depressing a PTT (push-to-talk) switch and speaking into a microphone. Moreover, the first and second dispatchers can also talk to one another. Thus remote dispatcher A can talk to remote dispatcher B and vice versa; and each of the remote dispatchers A and B can talk with transceiver C. This connection is known as a "parallel remote configuration."

In the parallel remote configuration shown in FIG. 1A, it is important that each communications participant hears all other communications participants at equal levels. However, for reliability, cost and other reasons (e.g., convenient conveyance of supervisory control signals not available to RF users), land lines are typically used to convey audio between the base station and the multiple dispatch/communicator locations. Thus, it has become necessary to connect multiple audio land lines (e.g., one for each dispatcher or other land-based communications facility) to a single radio base station—and to mix or sum the audio on the multiple lines for transmission over the RF channel. This multiple input arrangement has led to certain level equalization problems which have been solved in the past by using an audio compressor.

For reliable communications and intelligibility over the RF channel, it is essential that the base station average RF modulation level be kept at a relatively high percentage. So long as only one land line is connected to the base station, audio signal level adjustment is a relatively easy affair. A fixed amount of gain (active amplification) can be applied to the line signal (at the dispatcher end, the base station end, or at both ends). Longer lines typically exhibit more loss and therefore require more gain—but the amount of loss in a dedicated land line remains substantially constant over time.

However, different telephone lines may exhibit different loss characteristics. There can be a tremendous signal loss in a telephone line—and this signal loss can depend on a number of complex factors (e.g., the length of the telephone line, the amount of loading on one or both ends of the line, etc.) The line audio received by the base station may have a low level if the line exhibits a large loss. In the alternative, the line audio level may be relatively high if there is low line loss (such as where there is a short distance between the base station and a dispatcher location). Making several different lines all have the same loss is possible, but may be expensive and may require costly and specialized attenuators or active components for each line.

Anyone who has tried to talk on the telephone simultaneously with a long distance caller and someone on a local extension knows the frustration involved in trying to hear and understand a weak signal and a louder signal at the same time. Similarly, the radio dispatcher does not want to hear faint audio from, for example, a RF mobile unit and loud audio from, for example, another dispatcher. Likewise, the RF transceiver user should not have to turn his speaker volume down to listen to one talker and turn the volume up to listen to another talker.

It has long been known to use audio compression and limiting to increase the average modulation level of a RF carrier and to provide a relatively uniform audio output level that is substantially unaffected by variations in input level.

For example, broadcast stations have long used compressor/limiter amplifiers to boost average modulation level and prevent overmodulation. Typical audio sources may provide wide dB or more dynamic range (e.g., the so-called "noise floor" can be 80 or 90 dB "down" from the maximum output amplitude that can be provided without clipping). Even a standard microphone has a relatively large dynamic range. Typical RF transmitting equipment may offer much more restricted audio dynamic range.

Compression amplifiers "compress" the dynamic range(s) of the audio source(s) so that the output dynamic range "fits" into the available dynamic range provided by the transmitting and audio processing equipment. Moreover, some transmitting stations use an even greater degree of audio compression in order to make their signals "louder" on the average, thus increasing "talk range" (and effective coverage area).

Audio compression has long been used in two-way RF communications systems to increase "talk power" and effective range. See, for example, the following prior issued U.S. patents relating to audio compression amplifiers in RF systems:

U.S. Pat. No. 4,876,741
U.S. Pat. No. 4,718,116
U.S. Pat. No. 4,539,707
U.S. Pat. No. 4,381,488
U.S. Pat. No. 4,323,731
U.S. Pat. No. 4,216,427
U.S. Pat. No. 4,110,699
U.S. Pat. No. 3,449,684.

Ericsson-GE has in the past used analog compressors in its MASTR II Base Stations (see EGE maintenance manual LBI-30705) and in some remote control repeaters and transceivers.

In addition, a highly-specialized analog compression amplifier model 4006 Amplifier has long been included in EGE SimulCast repeater systems to maintain high average modulation level. See TELLABS technical manual 76-814006 for a description of such compression amplifier.

Generally, a compression amplifier must provide a variable gain (or attenuation) factor that is a function of input signal amplitude to provide a relatively constant output amplitude level that is substantially unaffected by input level variations. By varying the amount of gain (or attenuation) applied to the audio input when operating in a compression region, the compression amplifier can produce an output signal having a relatively uniform output level (e.g., for all input signals above a certain level).

But there are significant complexities involved in compressing audio signals. The selection of the gain factor applied by a compression amplifier typically depends on the average amplitude of the audio line signal. However, human speech is characterized by periods of activity interspersed with periods of silence. It is difficult or impossible to accurately determine an average amplitude at the beginning of an utterance, for example. The beginning of a spoken sentence is marked by silence followed by a nearly instantaneous increase in amplitude. During this brief period of time, the compressor must somehow determine an appropriate gain factor—even though it has very little information from which to set such gain factor.

Further, human speech includes many short duration bursts having high amplitudes between which are interspersed much lower amplitude speech components and pauses between phonemes. Processing a normal speech signal to generate an output signal of uniform amplitude despite variations in input level can result in loss of intelligibility (e.g., by causing background noise during pauses to be amplified to the level of the loudest speech components), and can introduce very unnatural sounding and distracting effects (e.g., "pumping", in which the background noise level "pumps" up and down in response to speech levels, and also "pop" noises due to discontinuous signals into a speaker).

To avoid such problems, most compressors designed for processing human speech provide a "fast attack, slow decay" response characteristic. Such amplifiers respond to the time average of input signal amplitude (rather than instantaneous input signal amplitude), and provide an asymmetrical gain response characteristic (i.e., they respond more rapidly to increase in input signal amplitude than they respond to decrease in signal amplitude). Attack time is the time it takes to settle to the proper output level when an increase in input signal amplitude occurs. Fast attack is important to prevent the first few phonemes from being noticeably louder than the following speech (causing unnatural sounding speech, and in RF systems, causing overmodulation). Slower release time is important to avoid bringing up the level of background noise during pauses between phonemes. The attack and release times should allow the compressor function to be as transparent as possible by not introducing annoying and abnormal level variations.

Prior hard-wired analog amplifier circuits provide a compressing variable gain transfer function by using a feedback network that adjusts amplifier gain depending on an average (over time) of the input signal level. A typical example of a prior art analog compression circuit is shown in the "Linear LSI Data and Applications Manual 1985" published by Signetics. This manual describes a "compandor" integrated circuit type NE570/571 that can be used as a basic compressor. Such a circuit can be used to provide "fast attack, slow release", and can also be configured to provide limiting action. A hard limiter is commonly associated with the attack time of the compressor. The limiting function prevents the compressor output signal from exceeding a predetermined level. For example, if the level of a signal suddenly increases, the compressor may apply too much gain to the signal, and a listener may hear a brief loud audio burst during this time. Such loud bursts are irritating to the listener. A hard limiter prevents these loud bursts from reaching the output (and in RF systems, prevents the transmitter from being overmodulated in violation of FCC regulations). Prior limiters have been implemented with comparators that ensure that the compressor output signal does not exceed a predetermined level.

Generally, a "fast attack, slow release" response characteristic is provided by using different RC networks. One of the networks (i.e., the one responsible for the attack gain) is effectively switched into circuit when a significant increase in input signal amplitude occurs, and provides a signal power integrator (i.e., a time averaging function) having a time constant associated with attack. The other RC network (i.e., the one responsible for release) is switched into circuit when a significant decrease in input signal amplitude occurs, and provides a signal power integrator having a time constant associated with release (the release time constant is usually much longer than the attack time constant). Such switching may be performed automatically by diode switches. Unfortunately, to alter the attack and release characteristics of such compression amplifiers, it is typically necessary to replace the RF network components.

Prior analog compressors have several shortcomings which can be generally categorized as inflexibility, slow response, circuit complexity, and non-ideal characteristics. Their operating parameters are inflexible and, as mentioned above, the attack and release parameters are fixed (changes in such parameters required component changes on the circuit board). For example, the EGE MASTR II prior art compressor applied a fixed finite change in the audio output that was a function of the input (previously, the change in the output was specified at 3 dB for a 30 dB change in the input). This compressor included a manual potentiometer that set the threshold for line input level at which the compressor began to compress, and used RC networks to provide attack and release signal integration over time. The compressor adjusted input signal gain only when the input signal exceeds the threshold (and otherwise provided linear amplification).

Prior art analog compressors are also generally slow to respond to changes in the audio input signal. The response times of RC networks and associated op amps limit the ranges of attack and release times the compressor may provide. Moreover, since many tradeoffs must be made in designing a hardware analog compressor, such compressors do not exhibit optimal signal processing characteristics. For example, analog compressor circuits do not produce a perfect flatness of input/output ratio over all frequency and other input signal variations. The dynamic performance of these compressors causes the input/output ratio to vary over the audio spectrum, introducing distortion. Moreover, the performance characteristics of analog compressors can be affected by environmental factors, aging and temperature, for example.

Analog compressors also employ relatively complex circuitry. These compressors have many components that increase the amount of circuit board "real estate" required, make circuit troubleshooting difficult, and increasing labor and parts costs associated with assembly and with maintaining manufacturing and replacement parts inventory.

It is generally known to use digital signal processing techniques to provide certain companding functions (e.g., for telephone applications). See, for example, U.S. Pat. No. 4,839,906 to Leveque et al. entitled "Processor Based Linked Compressor-Expander Telecommunications System" (1989); and U.S. Pat. No. 4,809,274 to Walker et al. entitled "Digital Audio Companding and Error Conditioning" (1989). Such systems convert an audio signal to a corresponding digital signal using an analog-to-digital converter; compress the signal in the digital domain (multiplying a digital value corresponds to gain adjustment in the analog domain); and convert the compressed digital signal to an analog signal using an digital-to-analog converter.

Much additional flexibility is provided by using digital signal processing to effect signal amplitude (dynamic range) compression. For example, compressor characteristics can be changed merely by effecting software changes (e.g., reloading or replacing an EEPROM) without necessitating hardware changes. In addition, compression can more easily be combined with other audio processing (e.g., filtering) without increasing parts count or circuit complexity.

The present invention relates to a RF base station system that uses audio compression to accommodate multiple audio line inputs. Two or more dispatchers (remote units) at different locations can be connected to a common base station over the same land line. The RF base station receives and processes audio signals from the multiple remote units simultaneously. The present invention ensures that each participant in a given RF communication (e.g., multiple land-based dispatchers and multiple RF transceiver users in the field) can hear all other participants without any one participant being louder than any other.

The RF base station provided by the present invention compresses a sum of multiple audio signals using a digital signal processor compressor so that all signals within the sum are equalized to a substantially uniform audio output level—despite differences in their input levels. Moreover, the RF base station provided by the present invention provides such compression in a manner that permits compression thresholds to be adjusted from a remote location. The RF base station provided by the present invention provides audio signal compression using digital signal processing techniques such that advanced features and flexibility are built into the system.

The present invention provides, in accordance with one of its important aspects, a digital, programmable compressor based on digital signal processing technology. In the preferred embodiment, line audio inputs from several sources are filtered, converted to digital signals, and processed by a digital signal processor (DSP). This DSP provides an audio compression function that selects and applies appropriate gains to the digitized audio signal. The compressed signal is converted to analog form, filtered and routed to a destination such as a RF transmitter modulator and/or a land line.

The present digital programmable compressor performs signal processing functions on the digitized audio signal in addition to amplitude compression so as to provide an enhanced output signal especially suited for RF transmission. For example, a noise blanking function is provided to minimize background noise. In the preferred embodiment, the DSP continually checks the input signal level, and outputs a zero (0) level if the input voltage is below a threshold value. Thus, the usual background hum and noise from audio lines are eliminated.

The compressor provided by the present invention also provides hard limiting to prevent the compressor output signal amplitude from exceeding a selected value. The automatic gain control function of the compressor is achieved to level multiple line inputs. Moreover, the present invention provides digital control (and remote setting) of the various thresholds and other control parameters set in the compressor. For example, the compressor includes software "potentiometers" that can be set by the digital signal processor. The compressor thresholds can be modified by resetting these "potentiometers."

The present invention provides additional flexibility in the operation of a compressor that allows the operating parameters and other performance characteristics to be controlled by a programmable processor. The present invention also provides optimal compression of input audio signals to generate an output signal which, for example, exhibits a substantially flat input/output signal ratio over a desired range. Moreover, another objective of the invention is to compress audio signals with an uncomplicated digital signal processing circuit that is relatively inexpensive to manufacture, operate and maintain.

BRIEF DESCRIPTION OF THE DRAWINGS

These and other features and advantages of the present invention will be better and more completely understood by referring to the following detailed description of a presently preferred exemplary embodiment in conjunction with the attached drawings, of which:

FIG. 3 is a high level block diagram of an exemplary digital signal processor arrangement in accordance with a presently preferred exemplary embodiment of the present invention shown in FIG. 1;

DETAILED DESCRIPTION OF A PRESENTLY PREFERRED EXEMPLARY EMBODIMENT

Figure 1:
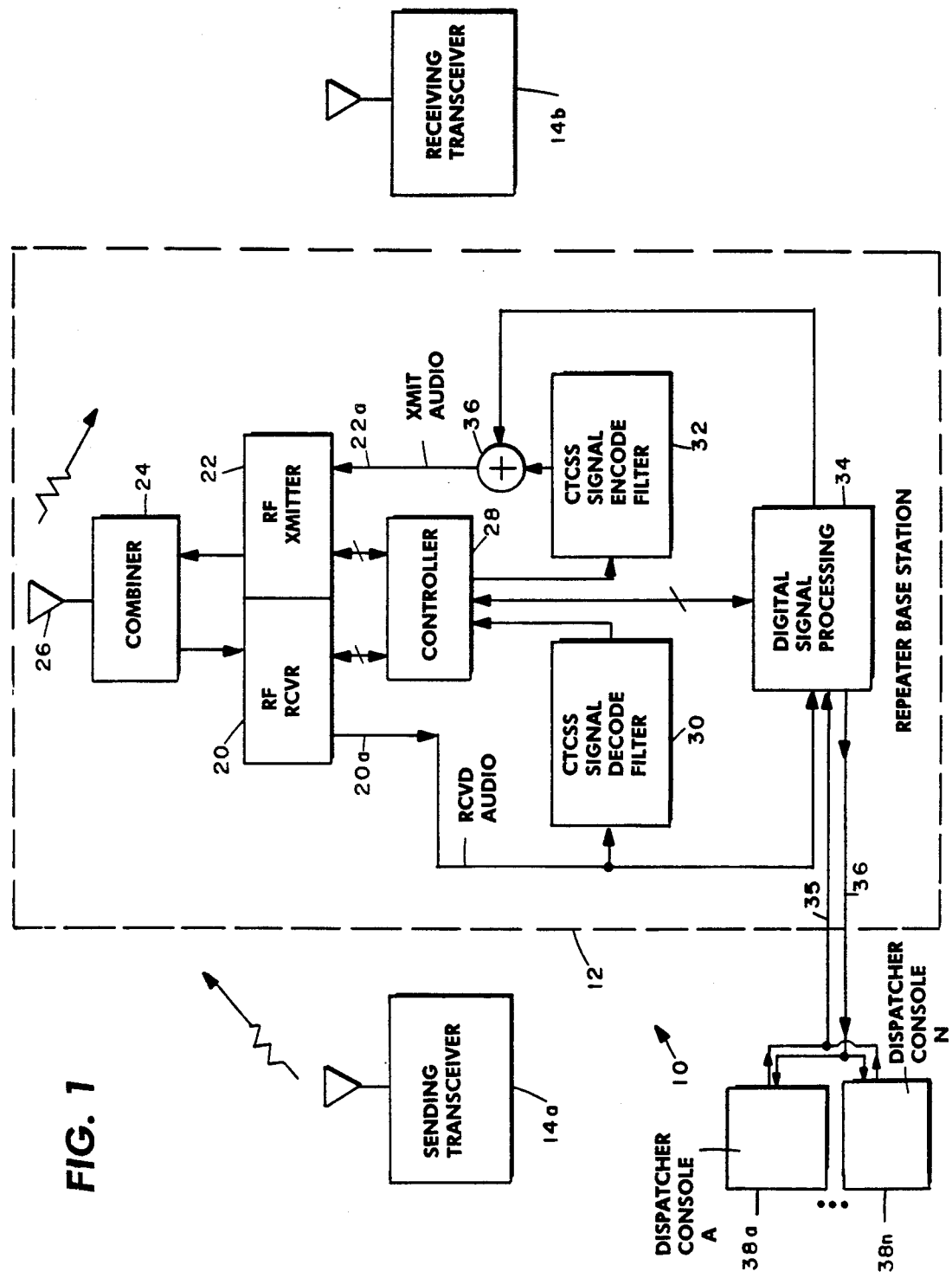
FIG. 1 is a high level block diagram of an exemplary RF base station communications system in accordance with the present invention.
Figure 1A:
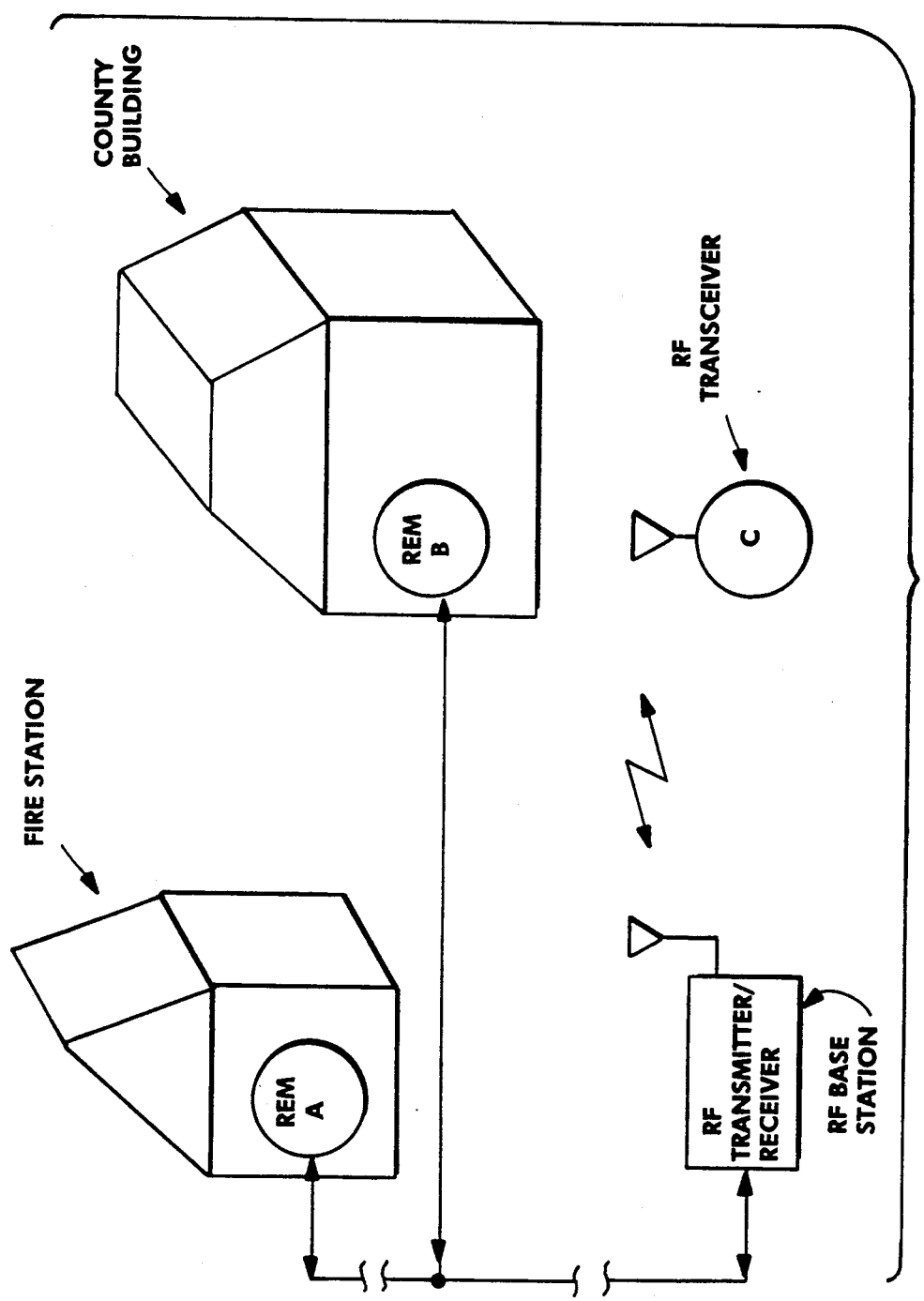
FIG. 1A is a schematic diagram of an exemplary multiple parallel remote configuration.

FIG. 1 is a high level schematic block diagram of the presently preferred exemplary embodiment of a duplex RF communications system 10. System 10 in the preferred embodiment includes a repeater base station 12 and at least two (and typically hundreds of) user transceivers 14a, 14b. Repeater base station 12 receives a RF transmission from a transceiver 14a and retransmits/regenerates the received RF transmission such that it can be received by other user transceivers 14b. Typically, base station 12 is located on top of a hill or a tall building and is equipped with a relatively high power RF transmitter —whereas user transceivers 14a, 14b may be located anywhere within a particular coverage area (e.g., behind obstructions, in valleys, or in "fringe" portions of the coverage area) and are typically equipped with only relatively low power RF transmitters (e.g., to save vehicle electrical power and to reduce cost). Thus, while geographical separated exemplary sending and receiving user transceivers 14a, 14b may be incapable of communicating with one another if simplex or other direct communications between them were possible, communications may be reliably established between those two transceivers (and, typically, among a large group of such user transceivers) via repeater base station 12.

In the preferred embodiment, each of user transceivers 14a, 14b transmits on one RF frequency and receives on a different RF frequency. However, in order to reduce costs (and for other reasons as well), the user transceivers 14a, 14b each operate in a "half-duplex" mode—meaning that they cannot transmit and receive simultaneously. Repeater base station 12, on the other hand, is capable in the preferred embodiment of simultaneously receiving RF signals on an input frequency and transmitting RF signals on an output frequency different from the input frequency (as is well understood by those skilled in the art, such "full duplex" mode of operation is the typical and preferred mode of operation for repeater base stations).

Repeater base station 12 in the preferred embodiment includes a RF receiver 20, a RF transmitter 22, a combiner 24 and antenna 26. In addition, repeater base station 12 in the preferred embodiment includes a digital controller 28 performing control operations under software control, a CTCSS signal decode filter 30, a CTCSS signal encode filter 32, and a digital signal processor 34. The digital signal processor 34 detects, filters and generates tones directly on audio carried by RF links and land lines 35 and 36. In accordance with an important aspect of the present invention, DSP 34 also provides audio compression and noise blanking functions.

The land lines 35, 36 may include multiple dispatcher consoles 38a, 38n with base station digital signal processor 34. Accordingly, there may be several audio line inputs to the digital signal processor for any given call. Of particular importance to the present invention is that the digital signal processor 34 performs compression on the audio line inputs 35. The digital signal processor 34 applies appropriate compression to a summation of the multiple line inputs (note that the summing node for the multiple dispatch consoles 38 may be and typically is located at base station 12). In the present embodiment, this compression may be performed by an analog compressor circuit (see application Ser. No. 620,422 referred to above). However, in the preferred embodiment the digital signal processor 34 provides compression to the line audio, and the analog compressor can thus be effectively bypassed (by controlling analog multiplexers appropriately) and its function replaced by the digital signal processor 34 whenever the optional digital signal processor is present.

In the preferred embodiment, RF receiver 20 is a conventional radio frequency receiver operating on a selected RF receive frequency. RF receiver 20 receives RF signals from sending transceiver(s) 14a via RF antenna 26, demodulates those received RF signals, and provides responsive received audio signals at its output 20a. RF transmitter 22 is a conventional high-power RF transmitter having an audio input 22a. RF transmitter 22 produces a RF carrier at a desired frequency (e.g., using a conventional digital frequency synthesizer type local oscillator), modulates the RF carrier with audio applied to audio input 22a, and amplifies the modulated signal before transmitting the signal to receiving transceiver(s) 14b via RF antenna 26. In the preferred embodiment, conventional combiner 24 is used to provide isolation between the receive and transmit RF frequencies to permit repeater base station 12 to operate in a full duplex mode (i.e., such that the signal transmitted by repeater base station 12 does not degrade the sensitivity of or otherwise interfere with simultaneous reception of incoming receive channel RF signals by RF receiver 20).

In the preferred embodiment, RF receiver 20 and RF transmitter 22 are digitally controlled by digital controller 28 (this controller in the preferred embodiment provides audio processing and executes prestored software routines controlling various parameters of RF receiver 20 and RF transmitter 22 such as, for example, RF transmit and receive frequencies, RF transmitter key and unkey, RF transmit power level, RF receive sensitivity, etc.).

In the preferred embodiment, the audio output signal provided by RF receiver 20 at output 20a is provided to CTCSS signal decode filter 30 and also to the digital signal processing block 34. The digital signal processing block 34 performs nearly all of the tone detection and generation with the exception of CTCSS tones. In addition, the digital signal processor provides some audio filtering functions. The resulting filtered tone signals for the RF link are combined with the signals from the CTCSS encoder at summer 36. The output of summer 36 is applied to the RF transmitter audio input 22a for modulating the transmitter RF output signal.

High Level Discussion of DSP Architecture

Figure 2:
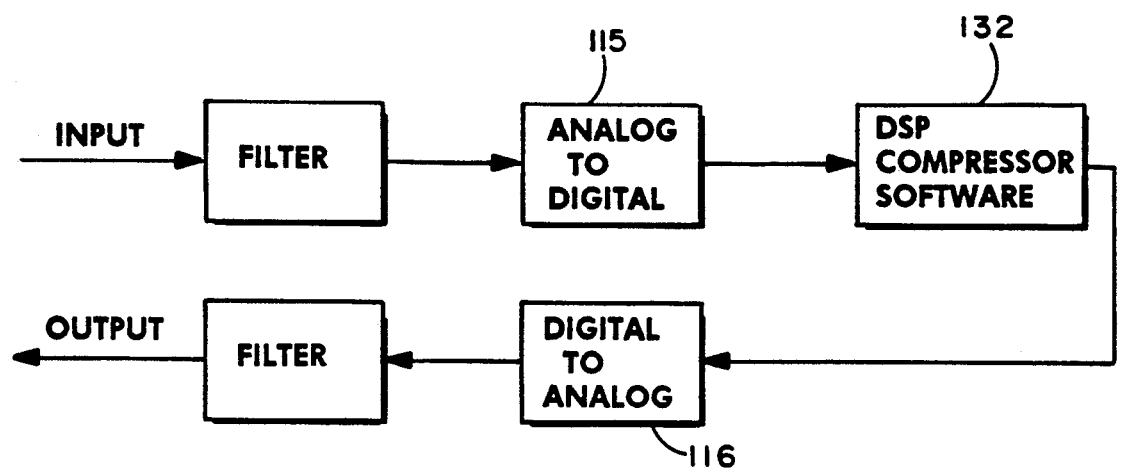
FIG. 2 is a schematic block diagram of the major compression-related functions performed by the digital signal processor arrangement shown in FIG. 1.

Details relating to the structure of digital signal processor 34 and its interconnection with main controller 28 and various audio sources, and destinations may be found in application Ser. No. 07/620,421 entitled "Digital Signal Processor for Radio Base Station" incorporated by reference herein. Briefly, the digital signal processor 34 operates upon two channels of audio. It conditions (e.g., filters) the audio inputs, digitizes the audio, processes the audio data in software, and sends transformed audio to analog outputs and signal analysis information to its digital output (see FIG. 2).

FIG. 3 is a high level block diagram of digital signal processor (DSP) 34. DSP 34 in the preferred embodiment includes a DSP microcontroller 132 and associated program EEPROM 112 and RAM 113; CODECs 115, 116; a line cancellation circuit 117; and a dual port RAM 114. DSP microcontroller 132 executed program control instructions from EEPROM 112 and may read from and write to RAM 113. In addition, DSP microcontroller 132 communicates with base station controller 28 via dual port RAM 114. CODECs 115, 116 are each bidirection (i.e., they each convert an analog input signal to a sampled digital PCM signal, and simultaneously convert a digital signal provided by the DSP microcontroller to an analog signal. Line cancellation circuit provides isolation between LINE IN and LINE OUT links so that the same twisted pair can be used for full duplex analog signal communications.

Detailed Discussion of DSP Architecture

Figure 4A:
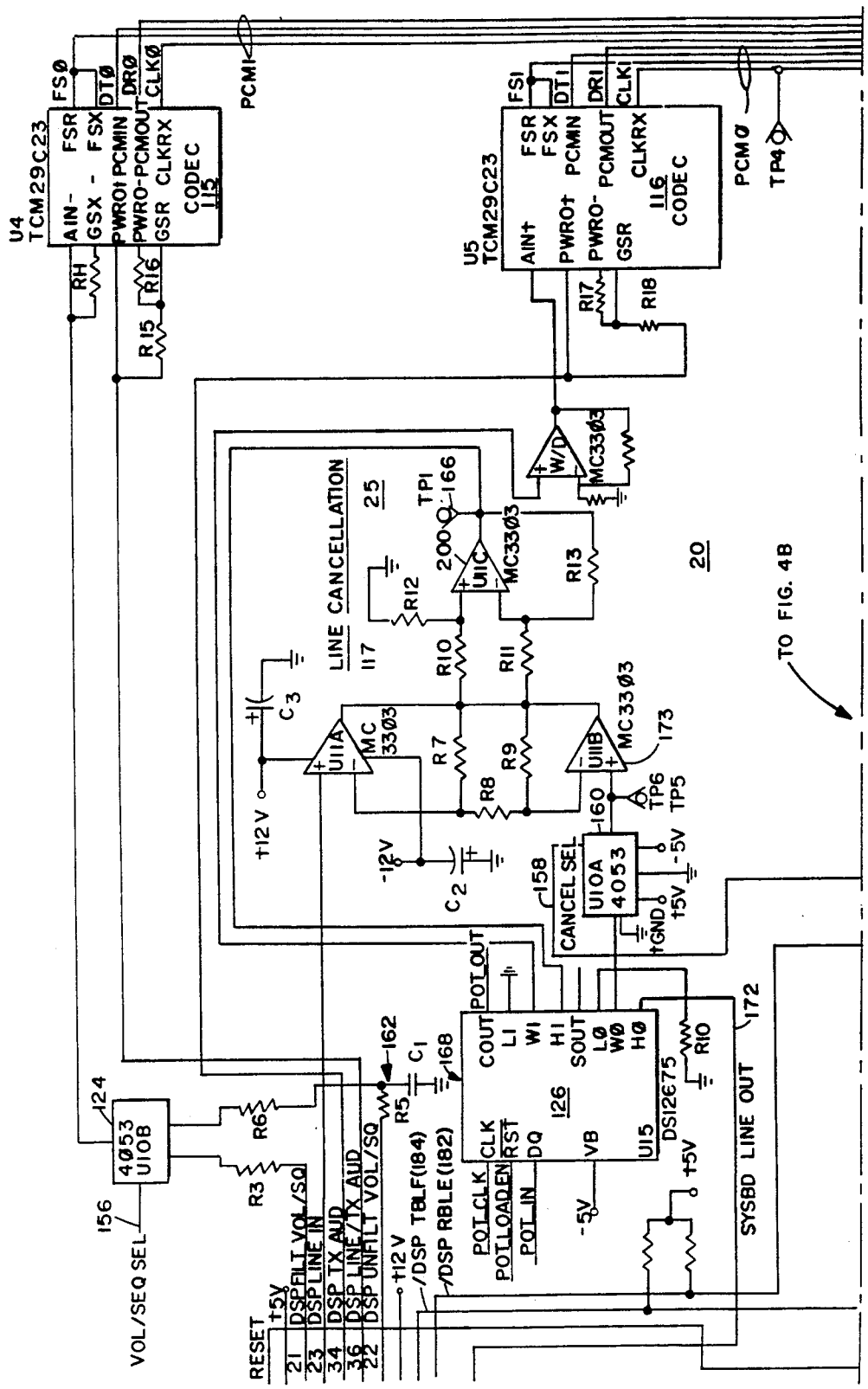
FIGS. 4A and 4B together are a detailed schematic circuit diagram of the FIG. 3 digital signal processor arrangement.
Figure 4B:
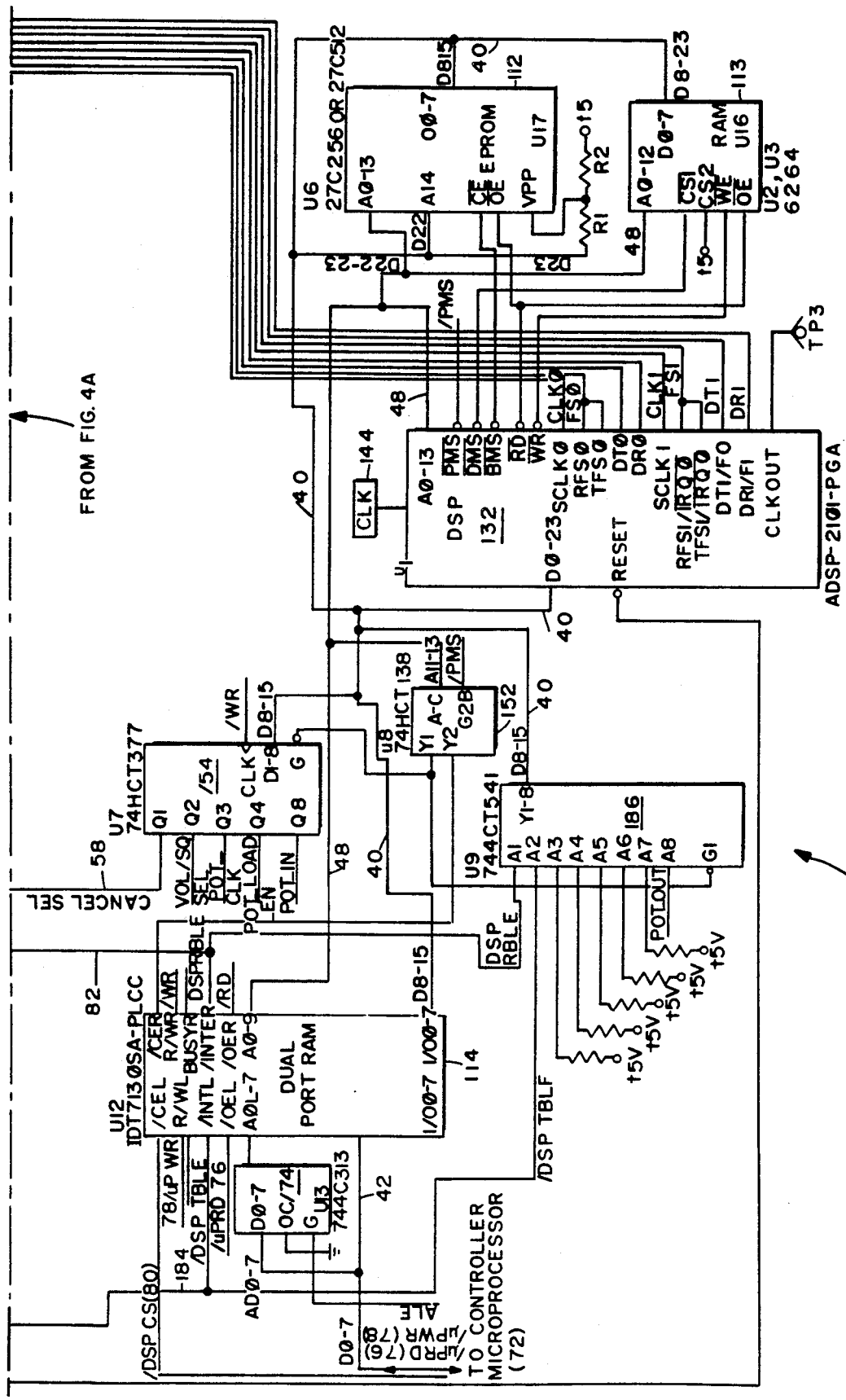

Referring now to FIGS. 4A and 4B, some audio inputs come controller 28 in the preferred embodiment and are named DSP_FILT_VOL/SQ, DSP_UNFILT_VOL/SQ, and DSP_LINE_IN. These signals are selected and conditioned through analog multiplexers (MUX) 124, 160; the op amps labelled, U11; and dual electronic programmable potentiometer 126. They are then sampled and digitized by codecs 115, 116. The digital audio data is then sent to DSP microcontroller 132 (a type ADSP-2101 digital signal processor integrated circuit in the preferred embodiment) for processing. After processing, the audio data is returned to CODECs 115 and/or 116 for digital-to-analog conversion. The transformed audio is output to controller 28 (or other destinations) on DSP_TX_AUD and DSP_LINE/TX_AUD.

All pertinent information from DSP chip 132 analysis of the audio is communicated digitally to the controller 28 through the dual port RAM 114. Messages are written to this memory 114 by the DSP chip 132 and then read from the memory by the controller 28.

The DSP arrangement 34 utilizes both digital and analog integrated circuits (ICs) in the preferred embodiment to offer a compact, flexible, and reliable solution for audio signal analysis and modification. All components are surface mounted. For clarity, the discussion which follows will address the DSP circuitry generally in the following order:

1) DSP and supporting circuitry;
2) analog input/output; and
3) parallel communication port.

The DSP arrangement performs its number crunching in the ADSP-2101 digital signal processing microcomputer 132. Clock 44 provides the 8.192 MHz clock signal required by the DSP chip 132.

The DSP microcomputer 132 can read from or write to both internal and external data memory. Two identical 8K×8 static RAMs U2 and U3, are used to form an 8K×16 external data memory 113 space. External 16-bit data memory is brought into the DSP on D8–D23.

The DSP microcomputer 132 operates from a 2K internal program memory. This program RAM is volatile; its contents are lost during poweroff sequences. Therefore, it is necessary to have non-volatile memory to safely hold the DSP arrangement code. The 16K×8 EPROM 112 performs this function. Upon reset, or during a "re-boot," up to 2K of internal program memory is loaded from this external "BOOT EPROM" 112. Boot EPROM 112 holds up to eight different pages which may be loaded. The selection of a 2K page of code is software-controlled except during reset (when boot page zero is always loaded).

In essence, boot memory page loading is a sequence of "read" cycles. The BMS pin goes low in order to enable the boot memory chip 112. Addresses are sequenced on lines A0 through A13, D22 and D23. The RD pin activates the data bus, D15 through D8, for each transfer from program memory 112 into the internal program memory space.

The boot EPROM circuitry also includes resistors R1 and R2. These resistors are zero ohms, and therefore are the equivalent of wires. If the capability of eight boot pages is necessary, R2 will not be present and R1 will be placed on the board. For this case, EPROM 112 pin 1 acts as an extra address pin which is connected to D23. If the capability of four boot pages is necessary, R1 will not be present and R2 will be placed on the board. For this case, EPROM 112 pin 1 acts as a program pin and is tied off to five volts.

The DSP microcontroller 132 receives and processes audio from both the receiver and the line simultaneously. There are two possible receiver audio input settings and two possible line audio input settings. These are 1) DSP_FILT_VOL/SQ or DSP_UNFILT_VOL/SQ input and 2) two-wire line input or four-wire line input.

This audio selection is actuated directly by the DSP microcontroller 132 but is user-programmable. The DSP 132 uses the address multiplexer 152 to select D flip-flop register 154. This is accomplished by setting A13–A11 to binary 100 when PMS goes low. Such a sequence will cause MUX 152 to go low and thus enable data to pass through the D flip-flops when WR goes low and then high. D8 and D9 are written to the outputs of flip-flops within register 154 providing outputs VOL/SQ_SEL and CANCEL_SEL. Depending upon these signals, digitally-controlled analog switches 124–160 route the appropriate signals to achieve the final audio input settings described above If VOL/SQ_SEL is a logic high, DSP_UNFIL_VOL/SQ is selected; otherwise DSP_FILT_VOL/SQ is selected. If CANCEL SEL is a logic high, four-wire operation is selected; otherwise two-wire operation is selected.

Each audio channel selection requires proper voltage level adjustment to insure an optimal conversion to the digital domain where it will be processed. This conversion is performed by codecs 115,116. In other words, the analog audio signals are conditioned to assure that their dynamic ranges may be accommodated by the codecs 115,116. The codecs will neither be underdriven nor saturated. This will result in a digital audio signal with uniform SNR following codec A/D conversion.

Filtered receiver input comes from the controller 128 following de-emphasis and channel guard reject filtering at a maximum of 1.16 mVrms. This input channel only requires amplification to assure that codec 115 has its full dynamic range utilized efficiently. The amplification factor is determined by resistors R5 and R6. The gain is 1.25. Therefore, the maximum input voltage to the codec 115 is 1.45 Vrms.

Unfiltered receiver input comes from the control module before de-emphasis or channel guard reject filtering at a maximum of 3 Vrms. Therefore, the DSP 110 must de-emphasize the signal in addition to performing level adjustment. This will assure that the full dynamic range of the codec 115 is utilized efficiently and that the audio signal is properly adjusted to account for pre-emphasis imposed during the previous transmission. De-emphasis is accomplished by an RC offering 20 dB/decade rolloff from 60 to 3000 Hz. This RC network induces 24.6 dB of attenuation at 1 kHz.

Level equalizing is accomplished by resistors (e.g., R5). They take the remaining 0.176 Vrms (following the de-emphasis stage) and induce a gain of 8.3. This results in a 1.46 Vrms maximum input voltage to the codec (again analyzed at 1 kHz).

Four-wire line input comes from the DPLX line input pair if the controller 20 when it is in a four-wire configuration Its audio is not in contention with audio which is leaving the station because there are two lines independently dedicated for the output signal. The line audio level-adjustment must be able to attenuate a 2.47 Vrms signal and amplify a 77.3 mVrms signal to the maximum input level of a codec (about 1.4 Vrms). In other words, it is necessary to be able to account for up to 30 db of line loss which may occur between the remote control unit and the station, keeping in mind the maximum input voltage to a codec.

In the four-wire configuration, DSP_LINE_IN is propagated to TP1 with only a gain of 1.09 induced by the differential instrumentation amplifier circuit of U11 (A,B,C) and R12-R17. This occurs because the amount subtracted from DSP_LINE_IN is AGND (see MUX 160).

Between the output of line cancellation circuit 117 and codec 116 there is a digitally controlled variable gain stage including electronic potentiometer 126 and op amp 200. The DSP microcontroller 132 addresses and serially loads a resistance value from 0 to 10 ohms into the dual programmable potentiometer 126. The digitally-controlled impedance form a gain through operational amplifier 200.

DSP microcontroller 132 loading of the dual programmable potentiometer 126 requires 34 cycles by the DSP microcontroller. The DSP uses the address multiplexer 152 to select D flip-chip. The DSP uses the address multiplexer 152 to select 154, a D flip-flop register Data is written to the D10 D11, and D15 outputs of resistor 154 known as POT_CLK, POT_LOAD_EN, and POT_IN which directly controls potentiometer 126. POT_CLK is a serial clock. POT_IN is serial data. POT_LOAD_EN is a serial load enable. During a "load" cycle, POT_LOAD_EN is held high. Seventeen POT_IN values are set up and held with respect to the rising edges of POT_CLK. The first value loaded into the dual programmable potentiometer is a "don't care." The following sixteen values comprise two 8-bit wiper positions. Wiper 1 gets loaded before wiper 0.

Two-wire line input comes from the line input of the control module when it is in a two-wire configuration. Its audio is in contention with audio which is leaving the station on the same two-wire pair. The DSP 34 must cancel out the interfering output audio from the input. In addition, it must amplify the input signal to account for the line loss of up to 30 dB which may occur between the remote control unit and the station.

Cancellation of transmit audio from receive audio on the two-wire pair is accomplished by line cancellation circuit 117, which includes differential instrumentation amplifier constructed with U11, and the DSP-controlled resistance through potentiometer 126. The SYSBD_LINE_OUT (a DSP input signal) is level adjusted through the programmable potentiometer 126 and then subtracted from the line input signal. After subtraction, the remaining input (received audio) is level adjusted by the remaining programmable potentiometer 126 (chip 126 is a dual pot) exactly as in the four-wire case.

The audio outputs, DSP_TX_AUD and DSP_LINE/TX_AUD, are sent directly to the controller 28 through the op-amp output stages on codecs 115,116. Resistor pairs, R7/R8 and R3/R4, determine the gain of the amplifiers.

The DSP 34 is equipped with a full-duplex parallel interface for communications between a host processor controller 34 and the on-board DSP chip 132. Communications are accomplished by the use of a dual-port RAM 114. Byte-wide messages are passed between controller 28 and DSP chip 132 by reading and writing data upon this common piece of memory 114. An external 8-bit host controller 28 may read and write to the dual port RAM 114. A 74HC373 address latch 174 is used by the 8-bit host controller 28 to latch the address AD7-AD0. The host controller 28 uses its ALE signal to perform the actual clocking into the latch. Once ALE has returned to logic one, AD7-AD0 become bidirectional. In the case of a "write" cycle, the host controller 28 sets up data on AD7-AD0. In the case of a "read" cycle, the host controller 28 releases the data lines AD7-AD0 into their high impedance state. Finally, the host controller 28 provides a low-going UP_RD or UP_WR pulse executes the desired read/write function. Note that reading and writing is only accomplished when the DSP_CS signal is held low. In this way, the host controller 28 exclusively selects the dual port memory 114 in order to prevent contention upon its AD bus.

The DSP chip 132 reads from and writes to the dual port RAM 114 by first selecting its communication memory space. This is accomplished by setting A13-A11 to binary 010 when PMS goes low. Such a sequence will MUX 152 output Y2 to go low and thus enable the dual port RAM 114. Once enabled, the communications memory is accessed with address lines A0-A9 and data lines D15-D8 in conjunction with a low-going RD or WR pulse.

The DSP chip 132 and host controller 28 coordinate message handling through the RBLE and TBLF flags.

The DSP chip 132 sets TBLF by writing to location 3FFH of the dual port RAM 114. It clears RBLE by reading from location 3FEH of the dual port RAM 114. Similarly, the host controller 28 may clear TBLF by reading from location 3FFH of the dual port RAM 114. It sets RBLE by writing to location 3FEH of the dual port RAM 114. (Note that a flag is set when it is low; it is clear when it is high.) In this way both host controller 28 and DSP chip 132 may monitor flag conditions in order to keep from trying to access the same locations in memory at the same time.

A tri-state buffer 186 is used by the DSP chip in order to read the RBLE and TBLF flags. This alleviates the possibility of contention on the DSP's data bus D15–D8. The RBLE and TBLF flags are read by first selecting buffer 186. This is accomplished by setting A13–A11 to binary 100 when PMS goes low. Such a sequence will cause MUX 152 output Y1 to go low and thus enable data to pass through the tri-state buffer upon RD going low. Buffer 186 outputs corresponding to RBLE and TBLF appear on D8 and D9 and are latched into the DSP 132.

DSP Compression Program Control Instructions

Figure 5:
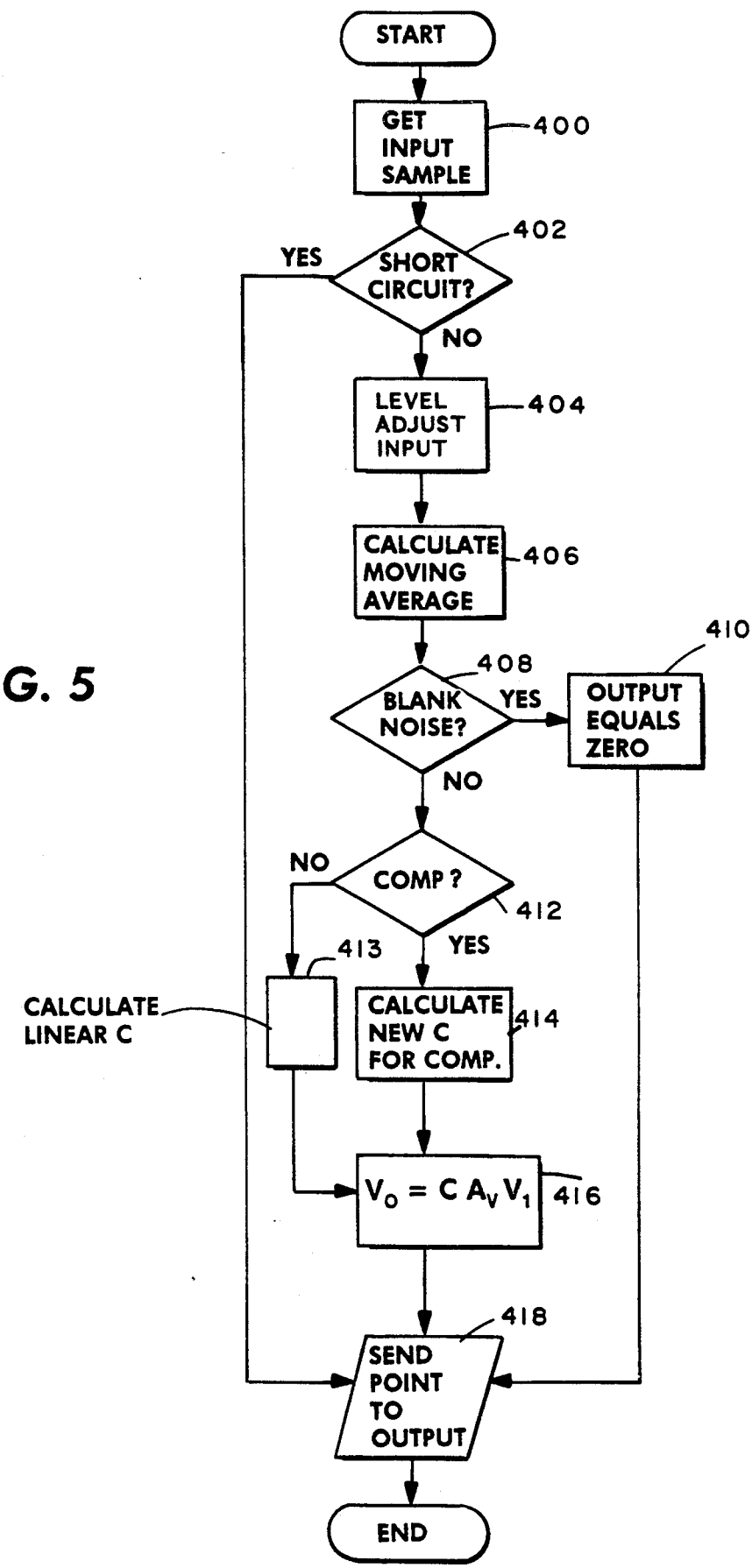
FIG. 5 is a high level flow chart of exemplary program control steps performed by the FIG. 3 digital signal processor arrangement to provide audio signal compression and other features.

FIG. 5 is a high level flowchart of exemplary program control steps performed by the preferred embodiment digital signal processor 34 DSP microcontroller 132 to provide a compression and noise blanking function. Program instructions stored within EPROM 112 represent these control steps. As mentioned above, at power up the DSP microcontroller 132 loads such program instructions from EPROM 112 into an internal RAM within the microcontroller, and begins executing the instructions.

Figure 6:
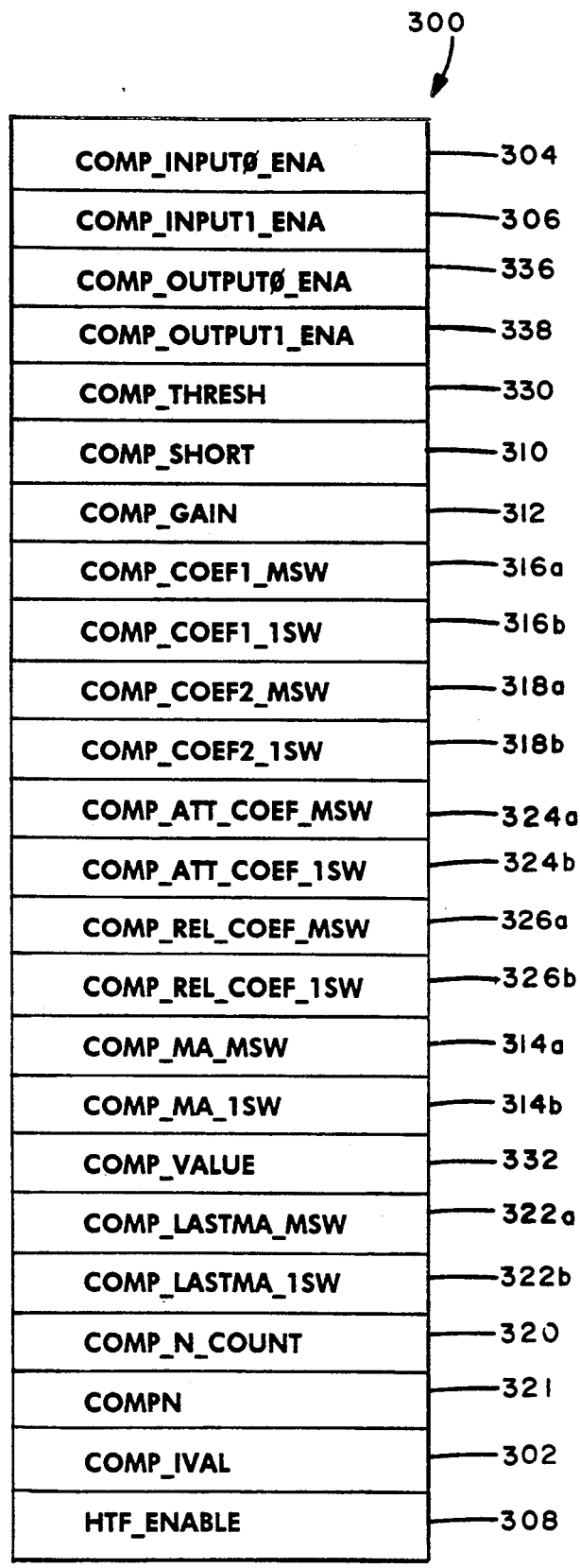
FIG. 6 is a schematic diagram showing an exemplary data structure the digital signal processor arrangement may use to perform the FIG. 5 program control steps.

FIG. 6 is a schematic diagram of an exemplary data structure 300 used and maintained by DSP microcontroller 132 to perform the program control instructions shown in FIG. 5. Data structure 300 is preferably obtained from main controller 28 via dual port RAM 114, and is thereafter stored within DSP scratchpad RAM 113. DSP microcontroller 132 typically alters certain of the values stored within data structure 300 as the compression function progresses, although other values within data structure 300 are treated by the DSP microcontroller as constants. Main controller 28 obtains the constant values for data structure 300 from its personality EEPROM (which EEPROM contents may be selectively rewritten by a remote user, see copending commonly assigned application Ser. No. 620,422. Thus, in the preferred embodiment a remote control station 50 (not shown) can easily change any or all of the constants stored within data structure 300—and hence alter the compression characteristics provided by DSP 34.

Referring now to FIGS. 5 and 6, DSP chip 132 first obtains an input sample ("SI") to process (block 400). The DSP 34 samples its input at a sampling rate of 8 kHz in the preferred embodiment. This means that every 125 microseconds (1/8000 seconds) the FIG. 5 compressor routine is called, with a newly digitized input sample (e.g., stored in storage location comp_ival 302 within data structure 300). In other words, the process begins on a digitally-represented voltage which is taken at regular intervals.

In this case, the input sample may come from one of three different sources CODEC 115, CODEC 116, or from a preprocessed internal source. Values stored in data structure entries comp_input0-ena 304, comp_input1_ena 306, htf_enable 308 instruct the DSP microcontroller 132 where to obtain the input sample from.

The input sample is assumed to be a number within the range of $(-1,1)$, and is represented in 1.15 format (i.e., sixteen binary digits with fifteen of the sixteen digits being to the right of the decimal point and the most significant bit indicating sign). This means that in base two (binary), we have:

+/− bit (0 = positive, 1 = negative)
15 bits past the decimal point
e.g., 0.110000000000000 binary=1/2+1/4=3/4 decimal.

In the preferred embodiment, the obtained input sample is stored in a temporary memory location SI.

Next, a test may be made to determine whether controller 28 has instructed DSP 34 to operate as a short circuit with no compression (block 402; or alternatively, this test may be performed after block 404 if desired). In the preferred embodiment, controller 28 may instruct DSP 34 to provide no input signal compression by writing an appropriate value to comp_short 310 within data structure 300. If these value indicates that no compression is to be applied, DSP microcontroller 132 simply passes the input sample directly to the output (block 418) (thus simulating a unity gain amplifier).

Assuming that compression is desired, the next step is to adjust the gain/attenuation of the input sample by a constant value comp_gain 312 stored within data structure 300 (block 404). Different input sources may require different constant compensation gains. Block 404 thus provides a constant amplification (gain) factor to compensate for different input sources or other factors. The input point is gain/attenuation adjusted by the equation $$V_{out} = A * V_{in}.$$

This factor, A, may, for example, be selected according to the loss in the telephone line. (The greater the line loss, the higher the value of A.) This value is called COMP_GAIN. It is in 6.10 fixed point format (this gain adjustment value thus requires multiplication and format conversion in the preferred embodiment). Format 6.10 means that in base two (binary), we have +/− bit (0 = positive, 1 = negative)
5 bits above the decimal point
10 bits past the decimal point
e.g. 000001.1000000000 binary = +1.5 decimal.

DSP microcontroller 132 next calculates the moving average energy over N points in the preferred embodiment (block 406). This moving average is an important feature of one aspect of the present invention, since it permits the compressor to integrate the energy of the input signal over time. In the preferred embodiment, the moving average models a lossy integrator circuit. More specifically, this moving average is used in conjunction with additional program control logic (to be explained shortly) to alter weighting coefficients in an averaging calculation. Such weighting coefficients may be regarded as effectively specifying the number of sample points over which the moving average is calculated (i.e., the "loss" factor of the lossy integrator circuit). The weighting factors are, in turn, used to calculate further moving average values. This process permits the same moving average calculation and associated logic to be used to model (and switch between) an "attack" RC (or other integrating) network and a "release" RC (or other integrating) network.

In the preferred embodiment, the moving average is defined by the expression $$MAnew = [(N-1)/N * MAold] + [(1/N) * Vin]$$

where Vin is the gain adjusted input signal, MAnew is the new moving average value, oldMA is the old moving average value, and N is the number of samples over which the moving average is calculated. In the preferred embodiment, N is a variable that changes depending upon whether the compressor is operating in the attack mode or the release mode.

The moving average is thus the sum of the old average and the new sample point. There is a disproportionate weighting of each factor which is selectable by the choice of N. The initial conditions for this equation are, $$MAnew = MAold = 0$$

The moving average follows the energy curve of the input signal (after level adjusting). In other words, for a low amplitude input sinusoid, there is a low moving average.

On a more detailed level, the old moving average value oldMA is stored in the comp_ma entries 314a, 314b within data structure 300 (double precision representation is used in the preferred embodiment to increase resolution). The moving average calculation is handled in double precision fixed point arithmetic in the preferred embodiment (in other words, 1.31 fixed point format is applied). In the preferred embodiment, the value $(N-1)/N$ is stored in words comp_coef1 316a, 316b. The DSP microcontroller 132 multiples comp_ma with comp_coef1 to obtain the value of $(N-1)/N * oldMA$ (e.g., by calling a subroutine that performs double precision multiplication). DSP microcontroller 132 then takes the absolute value of the input sample SI and multiples it by the value stored in data structure entries comp_coef2 318a, 318b (comp_coef2 contains the value $(1/N)$). Finally, DSP microcontroller 132 adds the two resulting products together (e.g., by calling a subroutine that performs double precision addition) to generate the value newMA (which it then stores in the data structure entry comp_ma 314 in place of oldMA).

In the preferred embodiment as part of block 406, DSP microcontroller 132 next decrements a timeout counter comp_n_count 320 and tests for a timeout (step not shown in FIG. 5). This time out counter is used to determine when it is time to adjust N in the moving average calculation (such adjustment is performed periodically but not for every sample in the preferred embodiment).

Selection of the value N in the moving average expression is very important in the preferred embodiment to the energy-tracking capabilities of the moving average. Notice that for large N the contribution of the new sample point is small; for small N the contribution of the new point is large.

Figure 7:
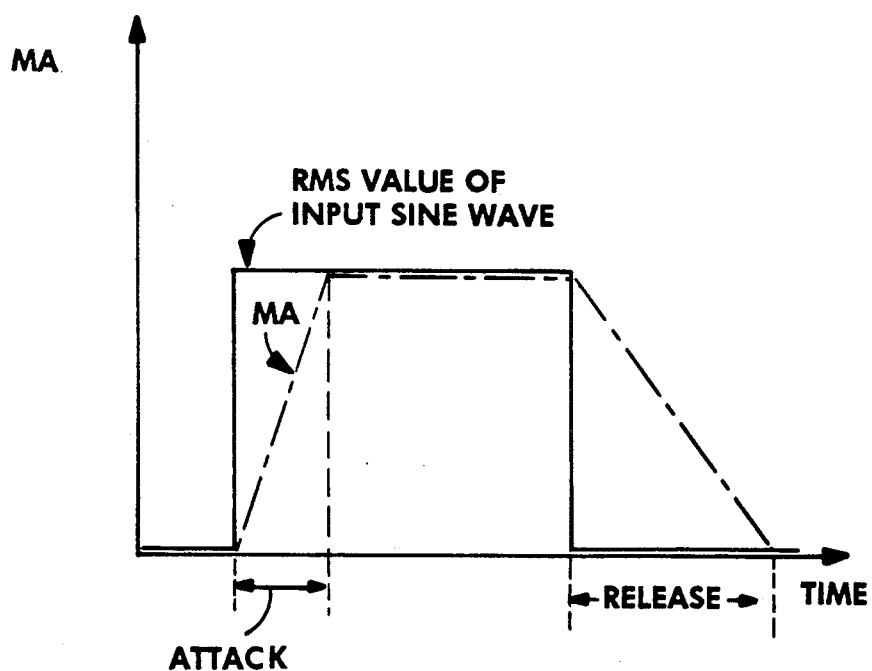
FIG. 7 is a simplified graph illustrating exemplary compressor attack and release characteristics.

In compression parameter terms, N defines the attack and release time of the compressor. FIG. 7 illustrates an exemplary attack and release characteristic responsive to a step function sinusoidal input signal (i.e., an input signal in which the sinusoidal signal exists only within a short burst or pulse). Attack time equals the time for the output to settle to a final value following a step increase in the input signal level (i.e., the time for compression to take effect). Release time equals the time for the output to regain its linear aspect following a step decrease in input RMS voltage (i.e., the time for compression to cease effect).

As can be seen from FIG. 7, the calculated moving average value does not exactly track the instantaneous power of the input signal; rather, MA ramps up after the input signal has risen to eventually meet the input signal power level during the "attack" portion of the compression characteristic, and ramps down after the input signal level has dropped during the "release" portion of the compression characteristic to eventually settle at the zero (or other minimum level). The exemplary characteristic shown in FIG. 7 provides a smaller N value for attack than for release (as would be typical during normal operation to provide a "fast attack, slow release" characteristic).

In the preferred embodiment, the moving average is checked at regular intervals for the differential parameter (DIFF[MA,LASTMA]). More specifically, in the preferred embodiment a subroutine is called periodically which produces attack and release times (i.e., selects N) based upon the moving average differential feature. This differential feature is checked only every nth point (as determined by comp_n_count 320) to reduce the number of transitions that would occur if the DSP microcontroller 132 attempted to determine whether it should be in attack or release mode based upon following the contour of an individual sine wave. Thus, in the preferred embodiment, the moving average is itself used to integrate input samples over time so as to determine how many input samples the moving average should integrate.

In the preferred embodiment, the differential mentioned above is calculated by subtracting the value comp_ma (i.e., the most recent moving average value calculated by block 406) with an older moving average value stored in data structure entry comp_lastma 322 (as will be explained, this comp_lastma is copied from comp_ma each time N is adjusted). If the moving average value comp_ma has increased since the last time N was adjusted, DSP 34 begins operating in the attack mode. Operating in the attack mode in the preferred embodiment merely means that a constant attack coefficient value stored in data structure entry $comp_{13} att_{13} coef$ 324 is used to select N. If, on the other hand, the moving average value comp_ma has decreased since the last time N was adjusted, the release value of N (represented by data structure entry comp_rel_coef 326) is selected.

As mentioned above, the preferred embodiment declares $(N-1)/N$ as comp_coef1 316 and $1/N$ as comp_coef2 318. These values are stored in double precision fixed point. The selected attack (or release) coefficient is simply copied to comp_coef1 in the preferred embodiment. A value for comp_coef2 318 is then, in the preferred embodiment, derived from the selected comp_coef1 316 by simply subtracting comp_coef1 from the value "7FFFFFFF" hex (the value "1" in 1.31 format) using double precision subtraction $(1 - N/1 = N/N - (N-1)/N = 1/N)$. Block 406 also resets the timer value comp n count 320 (e.g., by copying the constant timer value compN 321 into it), and copies comp ma 314 into comp_lastma 322. Note that adjustment of N in the preferred embodiment only begins to affect the moving average calculation upon processing of subsequent samples.

DSP microcontroller 132 next performs a noise blanking function (decision block 408, block 410). Noise blanking is a technique for achieving extremely low hum and noise measurements on the audio output in the absence of appreciable signal. If the moving average falls below a "valid signal" threshold (.e.g, as represented by a hard coded hex value "0010" in the preferred embodiment), the remainder of the compression steps are skipped and a zero is sent to the output (blocks 410, 418). In turn, this zero will convert to analog ground to the base station following digital-to-analog conversion. In the preferred embodiment the test for noise blanking is thus performed on the calculated moving average value, and not on the instantaneous input sample value SI.

Figure 8A:
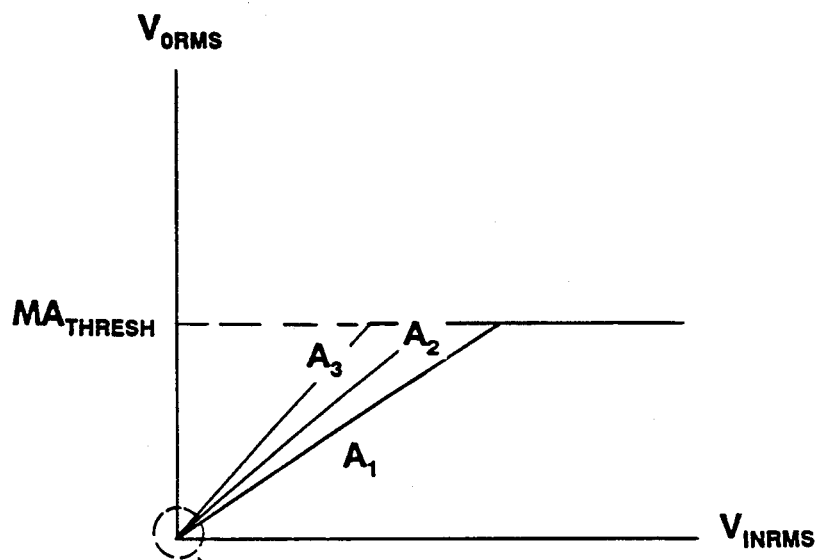
FIGS. 8A and 8B are simplified exemplary graphical illustrations showing the effect of varying the attack parameter and also showing the noise blanking feature of the preferred embodiment.
Figure 8B:
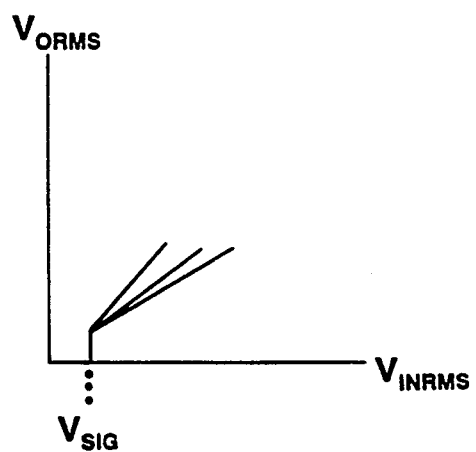

Mathematically we may describe noise blanking as follows:

$$Vout = 0, \quad MA < Vsig.$$

where Vsig is the noise blanking threshold. FIG. 8A is a graphical illustration of compressor gain attack characteristics for different exemplary attack thresholds, and FIG. 8B is a graphical illustration of an enlarged portion of the FIG. 8A graph near the origin. As can be seen in FIG. 8B, the output signal is zero until the input signal exceeds the noise blanking threshold Vsig. Thus, hum, noise and other extraneous signals will be blanked in the preferred embodiment (although they will affect the moving average MA calculated by block 406).

Assuming that noise blanking has not occurred, DSP microcontroller 132 next determines whether the system is operating in the linear region or in the compression region (block 412). This determination is made in the preferred embodiment by subtracting the comp_ma value 314 from a constant comp_thresh value 330 (in the preferred embodiment, compression gain adjustment is only performed when the moving average value exceeds the preset threshold value (otherwise, a linear gain characteristic is used). As mentioned, the constant comp_thresh value 300 (along with various other constants such as the attack and release coefficient values) can easily be altered remotely by simply rewriting the controller 28 personality PROM and/or personality RAM image.

If the compression system is operating in its linear region ("No" exit to decision block 413), a linear "compression" factor comp_value 332 is used to provide unity gain (block 413; this linear factor is hardcoded in the preferred embodiment and is simply written to data structure entry 332). On the other hand, if the system is operating in the compression region ("yes" exit to decision block 412), a compression factor comp_value 332 is calculated from the comp_thresh value 330 and the moving average value comp_ma 314 in accordance with the following expression:

$$comp\_value = comp\_thresh/comp\ ma.$$

The compression factor comp value is thus chosen to achieve an optimal compressor characteristic as follows:

$$C = 1, \quad MA < MAthresh$$
$$= MAthresh/MA, \quad MA > MAthresh$$

Figure 9:
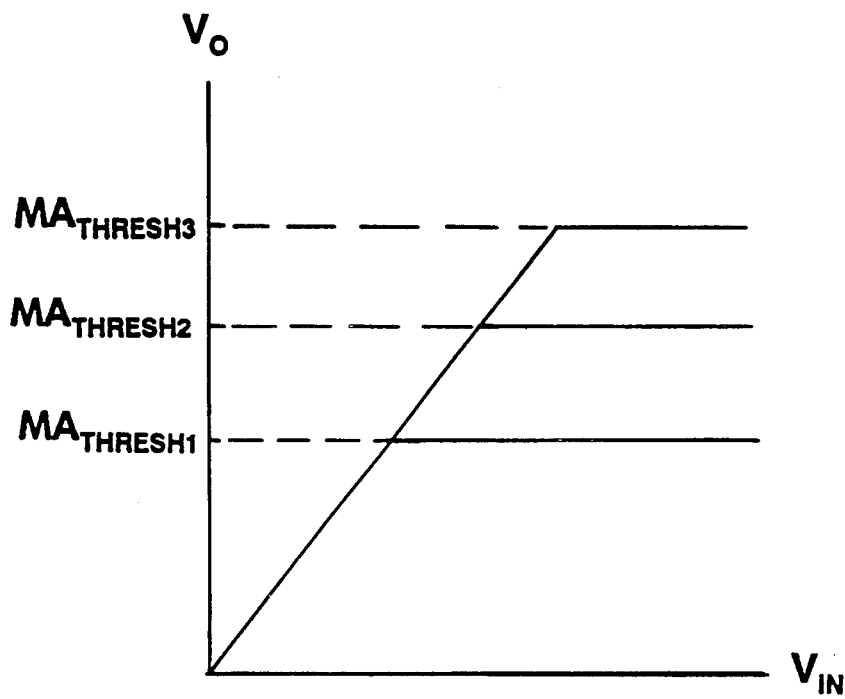
FIG. 9 is a simplified graph illustrating the effect of varying the compression threshold value in the preferred embodiment.

In other words, if the moving average energy is less than a threshold, the compression factor is independent of the moving average. However, if the moving average signal is greater than the threshold, the voltage value is level adjusted accordingly to assure a maximum RMS energy of MAthresh. FIG. 9 is a graphical illustration of the resulting gain characteristic for different exemplary compression threshold (comp_thresh) values.

The gain-adjusted input value provided by block 404 is finally multiplied by the compression factor comp_value calculated above. Mathematically, the operation on an input sample Vin resulting from blocks 404, 416 together is as follows:

$$Vout = C * A * Vin.$$

where C is the compression factor comp_value. In the preferred embodiment, block 416 operates on the results of block 404 (which were stored in the temporary location SI).

Finally, the DSP microcontroller 132 sends the adjusted sample SI to the output for D/A conversion. The destination output may be CODEC 115 and/or CODEC 166 (as selected by output enable value comp_output0_ena 336 or output enable value comp_output1_ena 338). The point is subsequently converted from a digital number to an analog signal.

In summary, a working compressor algorithm has been defined which uses the moving average for attack-/release selection, noise blanking, and compression value selection. There are three distinctive regions implemented in the Vout vs. Vin characteristic:

$$A*Vin < Vsig. \ Vout = 0;$$
$$Vsig < A*Vin < Vthresh, \ Vout = A*Vin.$$
$$A*Vin > Vthresh, \ Vout = C*A*Vin, \ C = \text{compress factor}$$

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In an RF base station of the type including a radio transmitter and a radio receiver, a method of providing audio compression to adjust the amplitude of audio signals transmitted and received by plural mobile transceivers including the following steps:
    (a) sampling an audio input signal;
    (b) calculating a moving average responsive to said audio input signal, said moving average averaging said sampled input signal over N samples wherein the effect of said sampled input signal on said moving average is based on an adjustable value of N;
    (c) determining whether to operate in an attack mode or in a release mode based on said moving average;
    (d) adjusting said value of N in response to the result of said determining step (c); and (e) adjusting the amplitude of said audio input signal based on said moving average.

2. A method as in claim 1 wherein said determining step (c) further includes the step of determining the difference between said calculated moving average and a previously calculated moving average and determining said attack mode when said difference is positive and said release mode when said difference is negative.

3. A method as in claim 1 wherein said determining step (c) includes the step of integrating said moving average.

4. In a RF base station of the type including a radio transmitter and a radio receiver, a method of providing audio signal amplitude compression including the following steps:
   (a) sampling an input signal;
   (b) calculating a moving average responsive to said input signal over N samples, wherein N varies depending on whether said audio compression is operated in an attack mode or a release mode;
   (c) determining whether said moving average exceeds a compression threshold value;
   (d) determining whether to operate in said attack mode or said release mode depending whether said moving average is increasing or decreasing over a predetermined time period;
   (e) if said determining step (c) reveals said moving average exceeds said compression threshold value, adjusting the value of N and the gain of said input signal in response to both said compression threshold and said calculated moving average.

5. The method according to claim 4, further comprising the steps of:
   testing whether said moving average is less than a noise threshold value, and
   if said testing step reveals said moving average is less than said noise threshold value, generating a zero level output signal.

6. A radio frequency (RF) transceiving system, comprising:
   one or more remote dispatch units;
   mobile RF transceivers operating in a half-duplex mode, wherein said one or more remote dispatch units and mobile RF transceivers can communicate over a single communication channel via an RF base station operating in a full duplex mode;
   said RF base station including:
   an RF transmitter for transmitting at one frequency;
   an RF receiver for receiving at another different frequency;
   first and second CODECs coupled respectively to said RF transceiver and to said RF receiver; and
   a digital signal processor coupled to said first and second CODECs, said digital signal processor preprogrammed to periodically receive a sampled input signal from one of said first and second CODECs, calculate a moving average responsive to said sampled input signal, apply compression gain adjustment to said sampled input signal responsive to said calculated moving average, and apply said gain adjusted sampled input signal to the other of said first and second CODECs.

* * * * *